United States Patent
Baars et al.

(10) Patent No.: US 8,809,690 B2
(45) Date of Patent: Aug. 19, 2014

(54) DIELECTRIC BOND PLIES FOR CIRCUITS AND MULTILAYER CIRCUITS, AND METHODS OF MANUFACTURE THEREOF

(75) Inventors: Dirk M. Baars, South Windsor, CT (US); Dale J. Doyle, Santee, CA (US); Sankar J. Paul, Branford, CT (US); Diana J. Williams, Queen Creek, AZ (US); Carlos L. Barton, Brooklyn, CT (US)

(73) Assignee: Rogers Corporation, Rogers, CT (US)

( * ) Notice: Subject to any disclaimer, the term of this patent is extended or adjusted under 35 U.S.C. 154(b) by 607 days.

(21) Appl. No.: 13/040,532

(22) Filed: Mar. 4, 2011

(65) Prior Publication Data

US 2011/0214906 A1 Sep. 8, 2011

Related U.S. Application Data

(60) Provisional application No. 61/310,333, filed on Mar. 4, 2010.

(51) Int. Cl.
*H05K 1/00* (2006.01)
(52) U.S. Cl.
USPC .......................................... 174/255; 174/258

(58) Field of Classification Search
USPC .................................. 174/250, 255, 258, 259
See application file for complete search history.

(56) References Cited

U.S. PATENT DOCUMENTS

| | | | |
|---|---|---|---|
| 5,298,331 A | 3/1994 | Kanakarajan et al. | |
| 5,948,533 A | 9/1999 | Gallagher et al. | |
| 5,990,553 A | 11/1999 | Morita et al. | |
| 6,245,696 B1 * | 6/2001 | Haas et al. | 442/348 |
| 7,348,080 B2 | 3/2008 | Kanakarajan | |
| 2007/0116964 A1 | 5/2007 | Guo et al. | |
| 2009/0030141 A1 * | 1/2009 | Balfour et al. | 524/578 |

* cited by examiner

*Primary Examiner* — Jeremy C Norris
(74) *Attorney, Agent, or Firm* — Cantor Colburn LLP (57) ABSTRACT

A bond ply, comprising a first outer layer comprising a thermosetting composition and a filler composition; a second outer layer comprising a thermosetting composition and a filler composition that is of the same type as that of the first outer layer; and an intermediate layer disposed between the first and the second outer layers, and comprising a thermosetting composition and a filler composition that is of the same type as the first and second outer layers, wherein the thermosetting composition of the intermediate layer has a degree of cure that is greater than a degree of cure for each of the thermosetting compositions of the first and the second outer layers.

22 Claims, 1 Drawing Sheet

DIELECTRIC BOND PLIES FOR CIRCUITS AND MULTILAYER CIRCUITS, AND METHODS OF MANUFACTURE THEREOF

CROSS-REFERENCE TO RELATED APPLICATION

This application claims the benefit of U.S. Provisional Application Ser. No. 61/310,333 filed Mar. 4, 2010, which is incorporated herein by reference.

BACKGROUND

This invention relates to dielectric bond plies and methods of manufacture thereof useful in the formation of circuits and multi-layer circuits.

Circuit materials are used in the manufacture of circuits and subassemblies and multi-layer circuits, and include circuit laminates, bond plies, resin coated conductive layers, free films, and cover films. Circuit materials are formed from dielectric materials that can include thermosetting and thermoplastic polymers. The polymers may be combined with fillers such as silica to adjust the dielectric or other properties of the polymers. One or more of the polymers in a bond ply is designed to soften or flow during manufacture of the circuit laminate or multi-layer circuit but not in use of the circuit.

A circuit laminate is a type of circuit material that has a conductive layer fixedly bound to a dielectric substrate layer. Double clad laminates have two conductive layers, one on each side of the dielectric substrate. Patterning a conductive layer of a laminate, for example by etching, provides a circuit layer, and thus a circuit. Multi-layer circuits comprise a plurality of conductive layers, at least one of which contains a conductive wiring pattern. Typically, multi-layer circuits are formed by laminating one or more circuits together using bond plies and, in some cases, adhesive-coated conductive layers, in proper alignment using heat and/or pressure. In use, the bond plies, or portions thereof, flow and completely fill the space and provide adhesion between circuits and/or between a circuit and a conductive layer, or between two conductive layers. In such multi-layer structures, after lamination, known hole-forming and plating technologies may be used to produce useful electrical pathways between conductive layers.

The bond plies used in the formation of rigid circuit laminates, multilayer circuits, and subassemblies, are often comprised of a glass fabric saturated with an uncured or B-staged polymer composition, which cures in the circuit or subassembly lamination process. During lamination, the polymer in this type of bond ply flows under heat and pressure into the features, e.g. conductor lines and spaces, on the surfaces of the opposing circuit layers being laminated together. The glass fabric provides a hard stop, which prevents the conductors on opposing layers from coming too close to each other causing low resistance, other reliability problems, and in the extreme, shorting. The glass fabric also helps control the horizontal, i.e. X-Y, flow of the polymer composition during lamination. Excessive X-Y flow can result in incomplete fill between conductor lines, which in turn can lead to multiple problems in further circuit fabrication and use.

Polymers used in bond plies are most often epoxies, but for improved electrical or thermal performance can be other polymers, e.g. polybutadienes, polyimides, polyphenyleneethers, or polybenzoxazines. Bond plies can be made with fabrics other than those based on glass, but these are used infrequently because they are expensive, have fabrication and use issues, or both. There are significant problems in the use of such fabric-based bond plies for dense and high speed, high electrical performance applications. The optimum design of a bond ply for such applications would be a structure in which the composition is homogeneous and has the same low dielectric constant, low dissipation factor and good thermal and mechanical properties throughout the bond ply structure. Such a homogeneous structure is not possible with bond plies based on glass fabric, because the glass usually has a higher dielectric constant and dissipation factor and very different mechanical properties from most polymers. Moreover, dense electrical circuits and subassemblies require very thin bond plies, e.g. less than 3 mils, which are costly and problematic to make, if they can be made at all, with very thin glass fabrics. Further, when glass fabric is used where there is a high density of Z-axis interconnects between layers in multilayer circuits, reliability problems can be caused by the hole forming processes. One such problem, conductive anodic filament growth, can cause low resistance and even shorts between closely spaced interconnects. This growth often occurs along the interface between the glass fibers and the cured polymer.

For these and other reasons, glass fabric based bond plies are not appropriate for dense, high electrical performance multilayer and subassembly applications. An alternate bond ply, which contains no glass or fabric, is comprised of a three layer structure. This bond ply, used most often in multilayer flex circuits, is comprised of a core dielectric layer which is a polymer film with uncured or B-staged dielectric layers on both sides. In fabrication and use the core layer is a film which does not melt or flow. During lamination to make multilayered structures, the outer dielectric layers flow and fill circuit features on the surfaces opposite to those being laminated to adhere the layers together, while the core layer provides a hard stop. Such film-based bond plies are sometimes used in dense multilayer structures. These film-based bond plies often use a polyimide film, such as Kapton®, with the adhesive outer layers being uncured or B-staged epoxy or acrylic. Fillers are sometimes used in the adhesives to help control flow on lamination.

These film-based bond plies have some of the same deficiencies as glass fabric-based bond plies in dense or high performance multilayers and subassemblies where the best electrical performance is required, because the base film and the adhesive layers have significantly different electrical and mechanical properties. Again, the non-homogeneity of the structure leads to reduced electrical performance and to reliability problems. Sometimes, uncured or B-staged polymer dielectric, often epoxy or acrylic-based polymer, is used alone as a bond ply. Such an adhesive-only bond ply can be homogeneous, but lamination of such bond plies to make multilayer structures is problematic due to the absence of a hard stop. The absence of a hard stop makes it difficult to accurately control conductor layer to conductor layer distances on lamination, which can lead to shorting and other electrical problems. Also, without glass fabric or a non-melting film core to help control X, Y, and Z flow on lamination, problems of too little flow, leading to voids between circuit conductors, or of too much flow, leading to squeeze-out, can occur, resulting in circuit reliability issues.

There accordingly remains a need in the art for a thin, homogeneous bond ply which does not include a glass fabric, has excellent electrical properties, in particular, low dielectric constant and low dissipation factor, good thermal and mechanical properties, and offers a hard stop. For optimum performance in dense, high speed, high signal integrity applications, the homogeneity should extend in all dimensions: X, Y and Z. These needs are not currently met by glass fabric-based bond plies, by existing film-based bond plies, or by adhesive-only bond plies.

SUMMARY OF INVENTION

In one embodiment, a bond ply comprises a first outer layer comprising a thermosetting composition and a filler composition; a second outer layer comprising a thermosetting composition and a filler composition that is of the same type as that of the first outer layer; and an intermediate layer disposed between the first and the second outer layers, and comprising a thermosetting composition and a filler composition that is of the same type as the first and second outer layers, wherein the thermosetting composition of the intermediate layer has a degree of cure that is greater than a degree of cure for each of the thermosetting compositions of the first and the second outer layers.

In another embodiment, an interconnect subassembly comprises a bond ply comprising: a first outer layer comprising a thermosetting composition and a filler composition; a second outer layer comprising a thermosetting composition and a filler composition that is of the same type as that of the first outer layer; and an intermediate layer disposed between the first and the second outer layers, and comprising a thermosetting composition and a filler composition that is of the same type as the first and second outer layers, wherein the thermosetting composition of the intermediate layer has a degree of cure that is greater than a degree of cure for each of the thermosetting compositions of the first and the second outer layers; and a conductive layer disposed on a side of one of the outer layers opposite the intermediate layer.

In still another embodiment, a multilayer circuit stackup for the formation of a multilayer circuit comprises a first circuit comprising a first dielectric layer and a first wiring layer disposed thereon; a second circuit comprising a second dielectric layer and a second wiring layer disposed thereon; and a bond ply disposed between the first circuit and the second circuit, wherein the bond ply comprises: a first outer layer comprising a thermosetting composition and a filler composition; a second outer layer comprising a thermosetting composition and a filler composition that is of the same type as that of the first outer layer; and an intermediate layer disposed between the first and the second outer layers, and comprising a thermosetting composition and a filler composition that is of the same type as the first and second outer layers, wherein an amount of the filler composition in the intermediate layer is different than an amount of filler in the first and second outer layers.

Methods for the manufacture of a circuit, a multilayer circuit, and a vertically integrated interconnect subassembly are also described.

In one embodiment, a method of making a bond ply comprises forming an intermediate layer comprising a thermosetting composition and a filler composition; curing the thermosetting composition of the intermediate layer to a first degree; coating a first outer layer comprising a thermosetting composition and a filler composition that is of the same type as the intermediate layer onto a surface of the intermediate layer; and coating a second outer layer comprising a thermosetting composition and a filler that is of the same type as the intermediate layer and the first outer layer onto a surface of the intermediate layer opposite the first layer.

In another embodiment, a method of making a circuit subassembly comprises disposing a bond ply between a patterned conductive layer and another conductive layer, a release layer, or a polymeric dielectric substrate layer to form a subassembly, wherein the bond ply comprises a first outer layer comprising a thermosetting composition and a filler composition; a second outer layer comprising a thermosetting composition and a filler composition that is of the same type as that of the first outer layer; and an intermediate layer disposed between the first and the second outer layers, and comprising a thermosetting composition and a filler composition that is of the same type as the first and second outer layers, wherein the thermosetting composition of the intermediate layer has a degree of cure that is greater than a degree of cure for each of the thermosetting compositions of the first and the second outer layers; and laminating the subassembly.

The invention is further illustrated by the following drawings, detailed description, and examples.

BRIEF DESCRIPTION OF DRAWINGS

Referring now to the exemplary drawings wherein like elements are numbered alike in the several figures.

DETAILED DESCRIPTION

Disclosed herein are dielectric bond plies useful in the manufacture of circuits and multi-layer circuits and subassemblies. The dielectric bond plies comprise a multilayer arrangement, wherein each layer comprises a thermosetting composition and a filler. In one embodiment, the thermosetting composition and type of filler therein are the same for each layer of the bond ply. The amount of filler in the thermosetting composition, however, can be the same or different for one or more of the layers. The intermediate layer of the bond ply is formed from the filled thermosetting composition, and is heated to cure the composition. The cured intermediate layer is then sandwiched between outer layers by assembling the thermosetting composition on each side of the intermediate layer. The final multilayer bond ply arrangement comprises an intermediate layer sandwiched between outer layers, each layer comprising the same thermosetting composition and filler, wherein the thermosetting composition of the intermediate layer has a degree of cure that is greater than a degree of cure each of the thermosetting compositions of the first and the second outer layers. In one application, the resulting multilayer bond ply can be disposed between two circuit laminates to adhere the laminates together and form a multi-layer circuit. In another application, the multilayer bond ply can be used to sequentially add layers to a core laminate. The multilayer bond ply is referred to herein for convenience as a three-layer bond ply, but it is to be understood that one or more additional layers can be present and disposed in any order between the first and second outer layers. The arrangement of the bond ply layers described herein provide certain improvements over existing bond plies used in circuit laminates and multi-layer circuits. The cured intermediate layer makes the assembly easier to handle during processing than a bond ply without a reinforcing layer, i.e. an adhesive-only type bond ply. Moreover, the substantially solid intermediate layer in the three-layer arrangement provides a hard stop during lamination. In other words, the cured intermediate layer can prevent overflow of the outer layers (that are cured to a lesser degree) caused by the application of too much pressure in a lamination press. By eliminating the need for a reinforcement layer, such as glass fiber, these improvements can be achieved with an overall thinner bond ply than currently used. Moreover, after cure of the outer layers, the dielectric material throughout the bond ply is homogenous. Homogeneity of the three-layer arrangement gives the bond ply uniform electrical and strength properties that are highly desired for advanced electrical/electronic applications.

In another embodiment of the bond ply, the thermosetting polymer composition is comprised of two polymers along with the filler. In this embodiment, the filler type and content are the same in the three layers, however, the ratio of the polymer components in the outer layers can be different from that of the intermediate layer. As an example, the ratio of the polymer components in the intermediate layer would be chosen to give this layer strength and toughness, while a somewhat different ratio of polymer components in the outer layers would be chosen to give optimum fill and flow. The polymer components selected for use would, of course, have similar electrical and thermal properties such that the final cured three layer composition has practically homogeneous electrical, thermal and mechanical properties. The applications for this embodiment would be the same as those described above for the other embodiments.

As mentioned, the dielectric thermosetting composition comprises a thermosetting polymer and a filler. The thermosetting polymer can be any polymer or combination of polymers useful as a dielectric material in a circuit laminate. As used herein, the term "dielectric" is used to describe electrically insulating materials having good bond strength with circuit traces, low dielectric constant, low dielectric loss, high breakdown voltage, low moisture absorption, high thermal stability, and the like. Moreover, useful dielectric thermosetting polymers will have good flexibility when in the cured state, enabling ease of processing in the manufacture of the three-layer bond ply and in use at the circuit processing facility. Exemplary dielectric thermosetting polymers can include, for example, those based on epoxy, polybutadiene, polyisoprene, functionalized polyphenyleneether, polyimide, combinations thereof, and the like.

In one embodiment the dielectric thermosetting compositions comprise a polybutadiene or polyisoprene polymer. A "polybutadiene or polyisoprene polymer" as used herein includes homopolymers derived from butadiene, homopolymers derived from isoprene, and copolymers derived from butadiene and/or isoprene and/or less than 50 weight percent (wt %) of a monomer co-curable with the butadiene and/or isoprene. Suitable monomers co-curable with butadiene and/or isoprene include monoethylenically unsaturated compounds such as acrylonitrile, ethacrylonitrile, methacrylonitrile, alpha-chloroacrylonitrile, beta-chloroacrylonitrile, alpha-bromoacrylonitrile, $C_{1-6}$ alkyl (meth)acrylates (for example, methyl (meth)acrylate, ethyl (meth)acrylate, n-butyl (meth)acrylate, n-propyl (meth)acrylate, and isopropyl (meth)acrylate), acrylamide, methacrylamide, maleimide, N-methyl maleimide, N-ethyl maleimide, itaconic acid, (meth)acrylic acid, alkenyl aromatic compounds as described below, and combinations comprising at least one of the foregoing monoethylenically unsaturated monomers.

The co-curable polybutadiene or polyisoprene polymer used in the dielectric thermosetting composition can be co-curable with a poly(arylene ether), as will be described in more detail below. In one embodiment, the polybutadiene or polyisoprene polymer is carboxy-functionalized. Functionalization can be accomplished using a polyfunctional compound having in the molecule both (i) a carbon-carbon double bond or a carbon-carbon triple bond, and (ii) one or more of a carboxy group, including a carboxylic acid, anhydride, amide, ester, or acid halide. An exemplary carboxy group is a carboxylic acid or ester. Examples of polyfunctional compounds that can provide a carboxylic acid functional group include maleic acid, maleic anhydride, fumaric acid, and citric acid. In particular, polybutadienes adducted with maleic anhydride can be used in the thermosetting composition. Exemplary maleinized polybutadiene polymers are commercially available, for example from Sartomer under the trade names RICON 130MA8, RICON 130MA13, RICON 130MA20, RICON 131MA5, RICON 131MA10, RICON 131MA17, RICON 131MA20, and RICON 156MA17. Exemplary maleinized polybutadiene-styrene copolymers are commercially available, for example, from Sartomer under the trade names RICON 184MA6. RICON 184MA6 is a butadiene-styrene copolymer adducted with maleic anhydride having styrene content from 17 to 27 wt % and number average molecular weight (Mn) of about 9,900 g/mole.

In one embodiment, the dielectric thermosetting compositions further comprise a poly(arylene ether), which can be in the form of a homopolymer or a copolymer, including a graft or a block copolymer. Combinations of various forms can be used. Poly(arylene ether)s comprise a plurality of structural units of formula (1):

wherein for each structural unit, each R and R' is independently hydrogen, halogen, primary or secondary $C_{1-7}$ alkyl, phenyl, $C_{1-7}$ aminoalkyl, $C_{1-7}$ alkenylalkyl, $C_{1-7}$ alkynylalkyl, $C_{1-7}$ alkoxy, $C_{6-10}$ aryl, and $C_{6-10}$ aryloxy. In some embodiments, each R is independently $C_{1-7}$ alkyl or phenyl, for example, $C_{1-4}$ alkyl, and each R' is independently hydrogen or methyl.

Exemplary poly(arylene ether)s include poly(2,6-dimethyl-1,4-phenylene ether), poly(2,6-diethyl-1,4-phenylene ether), poly(2,6-dipropyl-1,4-phenylene ether), poly(2-methyl-6-allyl-1,4-phenylene ether), poly(di-tert-butyl-dimethoxy-1,4-phenylene ether), poly(2,6-dichloromethyl-1,4-phenylene ether, poly(2,6-dibromomethyl-1,4-phenylene ether), poly(2,6-di(2-chloroethyl)-1,4-phenylene ether), poly(2,6-ditolyl-1,4-phenylene ether), poly(2,6-dichloro-1,4-phenylene ether), poly(2,6-diphenyl-1,4-phenylene ether), and poly(2,5-dimethyl-1,4-phenylene ether). A useful poly(arylene ether) comprises 2,6-dimethyl-1,4-phenylene ether units, optionally in combination with 2,3,6-trimethyl-1,4-phenylene ether units.

The poly(arylene ether) can be functionalized so as to provide a functional group that can co-react with the polybutadiene or polyisoprene and enhance adhesion between the conductive metal used to form the wiring layer and the dielectric layer. Functionalization can be accomplished using a polyfunctional compound having in the molecule both (i) a carbon-carbon double bond or a carbon-carbon triple bond, and (ii) one or more of a carboxy group, including a carboxylic acid, anhydride, amide, ester, or acid halide. In one embodiment the functional group is a carboxylic acid or ester group. Examples of polyfunctional compounds that can provide a carboxylic acid functional group include maleic acid, maleic anhydride, fumaric acid, and citric acid.

In particular, exemplary functionalized poly(arylene ether)s include the reaction product of a poly(arylene ether) and a cyclic carboxylic acid anhydride. Examples of suitable cyclic anhydrides are maleic anhydride, succinic anhydride, glutaric anhydride, adipic anhydride, and phthalic anhydride, more specifically, maleic anhydride. Modified poly(arylene ethers) such as maleinized poly(arylene ethers) can be produced by methods as described in U.S. Pat. No. 5,310,820, or are commercially available. Examples of commercially available suitable modified and unmodified poly(arylene ethers) include PPE-MA from Asahi (a maleinized poly(arylene ether)), and Blendex HPP820 from Chemtura (an unmodified poly(arylene ether)).

In still other embodiments, the dielectric thermosetting compositions further comprise an elastomeric polymer. The elastomeric polymer can be co-curable with the poly(arylene ether) and/or the polybutadiene or isoprene resin. Exemplary elastomers include elastomeric block copolymers comprising a block (A) derived from an alkenyl aromatic compound and a block (B) derived from a conjugated diene. The arrangement of blocks (A) and (B) includes linear and graft structures, including radial teleblock structures having branched chains. Examples of linear structures include diblock (A-B), triblock (A-B-A or B-A-B), tetrablock (A-B-A-B), and pentablock (A-B-A-B-A or B-A-B-A-B) structures as well as linear structures containing 6 or more blocks in total of A and B. Specific block copolymers include diblock, triblock, and tetrablock structures, and specifically the A-B diblock and A-B-A triblock structures.

The alkenyl aromatic compound providing the block (A) is represented by formula (2):

(2)

wherein each of $R^2$ and $R^3$ is independently hydrogen, $C_1$-$C_5$ alkyl, bromo, or chloro, and each of $R^4$, $R^5$, $R^6$, $R^7$, and $R^8$ is independently hydrogen, $C_1$-$C_{12}$ alkyl, $C_3$-$C_{12}$ cycloalkyl, $C_6$-$C_{12}$ aryl, $C_7$-$C_{12}$ aralkyl, $C_7$-$C_{12}$ alkaryl, $C_1$-$C_{12}$ alkoxy, $C_3$-$C_{12}$ cycloalkoxy, $C_6$-$C_{12}$ aryloxy, chloro, bromo, or hydroxy. Exemplary alkenyl aromatic compounds include styrene, 3-methylstyrene, 4-methylstyrene, 3,5-diethylstyrene, 4-n-propylstyrene, alpha-methylstyrene, alpha-methyl vinyltoluene, alpha-chlorostyrene, alpha-bromostyrene, dichlorostyrene, dibromostyrene, tetra-chlorostyrene, and the like, and combinations comprising at least one of the foregoing compounds. Styrene and/or alpha-methylstyrene are often used.

Specific examples of the conjugated dienes used to provide block (B) include 1,3-butadiene, 2-methyl-1,3-butadiene (isoprene), 2,3-dimethyl-1,3-butadiene, and 1,3-pentadiene, specifically 1,3-butadiene and isoprene. A combination of conjugated dienes can be used. The block (B) derived from a conjugated diene is optionally partially or fully hydrogenated.

Exemplary block copolymers comprising a block (A) derived from an alkenyl aromatic compound and block (B) derived from a conjugated diene include styrene-butadiene diblock copolymer (SB), styrene-butadiene-styrene triblock copolymer (SBS), styrene-isoprene diblock copolymer (SI), styrene-isoprene-styrene triblock copolymer (SIS), styrene-(ethylene-butylene)-styrene triblock copolymer (SEBS), styrene-(ethylene-propylene)-styrene triblock copolymer (SEPS), and styrene-(ethylene-butylene) diblock copolymer (SEB). Such polymers are commercially available, for example from Shell Chemical Corporation under the trade names KRATON D-1101, KRATON D-1102, KRATON D-1107, KRATON D-1111, KRATON D-1116, KRATON D-1117, KRATON D-1118, KRATON D-1119, KRATON D-1122, KRATON D-1135X, KRATON D-1184, KRATON D-1144X, KRATON D-1300X, KRATON D-4141, KRATON D-4158, KRATON G1726, and KRATON G-1652. KRATON D-1118 is a solid SB-SBS copolymer. This copolymer has polystyrene end blocks and a rubbery polybutadiene mid-block with about 20% SBS triblock and about 80% SB diblock. It is a low modulus, low cohesive strength, soft rubber.

The relative amount of the poly(arylene ether), the polybutadiene or polyisoprene polymer, and the elastomeric block copolymer, if used, will depend on the intended use of the dielectric thermosetting composition (e.g., what type of application the three-layer bond ply will be used, whether the bond ply is used to adhere two circuit laminates, or used to buildup layers on a core, etc.) and on the desired properties, including the mechanical properties of the intermediate layer and the fill and flow properties of the outer layers of the three layer bond ply. It has been found that use of a poly(arylene ether) provides increased bond strength between a conductive metal layer, particularly copper, and a relatively nonpolar dielectric substrate material. This result is particularly surprising since poly(arylene ether)s are themselves nonpolar. Use of a polybutadiene or polyisoprene polymer further increases the high temperature resistance of the dielectric materials, particularly when these polymers are carboxy-functionalized. Use of an elastomeric block copolymer may function to compatibilize the components of the dielectric materials. Determination of the appropriate quantities of each component can be done without undue experimentation, using the guidance provided herein.

In one embodiment, the dielectric thermosetting composition comprises up to 100 wt % of the poly(arylene) ether, specifically the carboxy-functionalized poly(arylene ether). In another embodiment, the dielectric thermosetting composition consists essentially of up to 100 wt % of the poly (arylene) ether, specifically the carboxy-functionalized poly (arylene) ether.

The dielectric thermosetting composition can alternatively comprise about 20 to about 99 wt %, specifically about 30 to about 80 wt %, more specifically about 40 to about 60 wt % of the poly(arylene ether), preferably the carboxy-functionalized poly(arylene ether), and about 1 to about 80 wt %, specifically 11 to about 70 wt %, more specifically about 20 to about 70 wt %, still more specifically about 40 to about 60 wt % of the polybutadiene or polyisoprene polymer, preferably the carboxy-functionalized polybutadiene or polyisoprene polymer, each of the foregoing amounts being based on the total weight of the dielectric thermosetting composition.

In still another embodiment, the dielectric thermosetting composition comprises about 20 to about 98 wt %, specifically about 25 to about 75 wt %, more specifically about 30 to about 50 wt % of the poly(arylene ether), preferably the carboxy-functionalized poly(arylene ether); about 1 to about 79 wt %, specifically about 10 to about 60 wt %, more specifically about 20 to about 40 wt % of the co-curable polybutadiene or polyisoprene polymer, preferably the co-curable carboxy-functionalized polybutadiene or polyisoprene polymer; and about 1 to about 79 wt %, specifically about 10 to about 60 wt %, more specifically about 20 to about 40 wt % of the elastomeric block copolymer, each based on the total weight of the thermosetting composition.

In addition to the one or more of the polymers described above, and the fillers described below, the dielectric thermosetting composition can further optionally comprise additives such as cure initiators, crosslinking agents, viscosity modifiers, coupling agents, wetting agents, flame retardants, antioxidants, and coupling agents. The particular choice of additives depends upon the particular application of the three-layer bond ply, and the desired properties for that application, and are selected so as to enhance or not substantially adversely affect the electrical properties of the circuit laminates, such as dielectric constant, dissipation factor, dielectric loss, and/or other desired properties.

Exemplary cure initiators include those useful in initiating cure (cross-linking) of the polymers, in the dielectric composition. Examples include, but are not limited to, azides, peroxides, sulfur, and sulfur derivatives. Free radical initiators are especially desirable as cure initiators. Examples of free radical initiators include peroxides, hydroperoxides, and non-peroxide initiators such as 2,3-dimethyl-2,3-diphenyl butane. Examples of peroxide curing agents include dicumyl peroxide, alpha, alpha-di(t-butylperoxy)-m,p-diisopropylbenzene, 2,5-dimethyl-2,5-di(t-butylperoxy)hexane-3, and 2,5-dimethyl-2,5-di(t-butylperoxy)hexyne-3, and mixtures comprising one or more of the foregoing cure initiators. The cure initiator, when used, is typically present in an amount of about 0.1 wt % to about 5 wt %, based on the total weight of the dielectric thermosetting composition.

Crosslinking agents are reactive monomers or polymers that increase the cross-link density upon cure of the dielectric material. In one embodiment, such reactive monomers or polymers are capable of co-reacting with a polymer in the adhesive polymer and a polymer in the circuit substrate composition. Examples of useful reactive monomers include styrene, divinyl benzene, vinyl toluene, divinyl benzene, triallylcyanurate, diallylphthalate, and multifunctional acrylate monomers (such as Sartomer compounds available from Sartomer Co.), among others, all of which are commercially available. Useful amounts of crosslinking agents are about 0.1 to about 50 wt %, based on the total weight of the dielectric material composition.

Exemplary antioxidants include radical scavengers and metal deactivators. A non-limiting example of a free radical scavenger is poly[[6-(1,1,3,3-tetramethylbutyl)amino-s-triazine-2,4-dyil][(2,2,6,6,-tetramethyl-4-piperidyl)imino]hexamethylene[(2,2,6,6-tetramethyl-4-piperidyl)imino]], commercially available from Ciba Chemicals under the tradename Chimmasorb 944. A non-limiting example of a metal deactivator is 2,2-oxalyldiamido bis[ethyl 3-(3,5-di-t-butyl-4-hydroxyphenyl)propionate] commercially available from Uniroyal Chemical (Middlebury, Conn.) under the tradename Naugard XL-1. A single antioxidant or a mixture of two or more antioxidants can be used. Antioxidants are typically present in amounts of up to about 3 wt %, specifically about 0.5 to about 2.0 wt %, based on the total weight of the dielectric composition.

Coupling agents can be present to promote the formation of or participate in covalent bonds connecting a metal surface or filler surface with a polymer. Exemplary coupling agents include 3-mercaptopropylmethyldimethoxy silane and 3-mercaptopropyltrimethoxy silane and hexamethylenedisilazanes. Coupling agents, when present, can be present in amounts of about 0.1 to about 2.0 wt %, based on the total weight of the dielectric thermosetting composition.

Exemplary flame retardants include, for example, a metal hydroxide containing aluminum, magnesium, zinc, boron, calcium, nickel, cobalt, tin, molybdenum, copper, iron, titanium, or a combination thereof, for example aluminum trihydroxide, magnesium hydroxide, calcium hydroxide, iron hydroxide, and the like; a metal oxide such as antimony oxide, antimony trioxide, antimony pentoxide, iron oxide, titanium oxide, manganese oxide, magnesium oxide, zirconium oxide, zinc oxide, molybdenum oxide, cobalt oxide, bismuth oxide, chromium oxide, tin oxide, nickel oxide, copper oxide, tungsten oxide, and the like; metal borates such as zinc borate, zinc metaborate, barium metaborate, and the like; metal carbonates such as zinc carbonate, magnesium carbonate, calcium carbonate, barium carbonate, and the like; melamine cyanurate, melamine phosphate, and the like; carbon black, expandable graphite flakes (for example those available from GrafTech International, Ltd. under the trade name GRAFGUARD), and the like; nanoclays; and brominated compounds.

In another embodiment, the dielectric thermosetting composition is an epoxy composition. The epoxy composition is a uniform blend that comprises, at minimum, an adduct of an epoxy resin and a functional group-containing nitrile rubber as described in further detail below; and a curing system comprising a curing agent and a curing accelerator. The epoxy composition further preferably comprises an epoxy resin and a non-halogenated flame retardant. The thermosetting epoxy composition can further optionally comprise an inorganic filler and/or a vulcanizing agent for the nitrile rubber and/or other additives.

Exemplary epoxy resins for the formation of the epoxy-nitrile rubber adduct are polyfunctional epoxy resins having at least two epoxy groups per molecule. Examples of epoxy resins include bisphenol A epoxy resins, bisphenol F epoxy resins, novolac epoxy resins, glycidylamine epoxy resins, and the like. While the preferred embodiment herein is halogen-free, it is possible to use a halogenated or, in particular, a brominated epoxy resin, or a combination of a non-halogenated epoxy resin and a halogenated epoxy resin. A specific epoxy is a copolymer of epichlorohydrin and bisphenol-A. It is advantageous to use solid epoxy resins for the formation of the epoxy-nitrile rubber adduct. Adducts made using liquid epoxies produce adhesives that are tacky and flow excessively when used at high concentrations (greater than about 25% by weight) in the adhesive.

The nitrile rubber used to form the adduct is functionalized to provide reactivity with the epoxy residues in the epoxy resin. Exemplary functional groups include, for example, amino groups and/or carboxylate groups. In an embodiment, carboxylate groups are used. The functional groups can be introduced to the nitrile rubber during polymerization of thereof, by adding functional group-containing monomers to the polymerization mixture, or by modification of terminal groups of the rubber by means such as oxidation. Exemplary functional-group containing monomers include carboxylic acid terminated monomers such as, for example, acrylic acid, methacrylic acid, maleic acid, fumaric acid, itaconic acid, or a combination comprising at least one of the foregoing monomers.

The nitrile rubbers can be prepared by solution or emulsion radical polymerization. In one embodiment, the rubbers are prepared by a method that minimizes the ionic content of the rubber, preferably solution polymerization. Such rubbers are often of lower molecular weight, and are thus liquid. A preferred nitrile rubber is a carboxy-terminal liquid nitrile rubber having a low ionic content.

The adduct of the epoxy resin and functional group-containing nitrile rubber can be obtained by combining the epoxy resin and rubber, optionally in the presence of a catalyst, and heating the composition to provide the adduct, wherein the ratio of epoxy groups is in excess to the functional groups on the rubber. The ratio of epoxy groups and functional groups, reaction time, and conditions is adjusted so as to provide an adduct wherein most (greater than 50%, greater than 75%, greater than 90%, or greater than 95% of the functional groups are reacted, while minimizing increase in molecular weight by the formation of crosslinks. The amount of nitrile rubber in the adduct is selected to provide the appropriate ratio of epoxy groups to epoxy-reactive functional groups, and to provide the desired properties to the adhesive. The rubber content of the adhesive can be about 10 to about 60 wt. % of the adduct, specifically about 25 to about 45 wt. %. A suitable adduct having an elastomer content of 32 wt % is prepared from solid bisphenol-A epoxy resin and a carboxy terminated butadiene-acrylonitrile elastomer, and is available under the trade name HYPDX® RK84, from CVC Specialty Chemicals Inc.

The epoxy composition further comprises a cure system. The cure system comprises a curing agent for the epoxy resin, which can be selected from various known compounds used for cure of epoxy resins, including aliphatic amine compounds, aromatic amine compounds, acid anhydride compounds, dicyandiamide, complexes of boron trifluoride and an amine compound, phenolic and novolac resins, and the like. The curing agents can be used either singly or as a combination of two kinds. 4,4'-Diamino diphenyl sulfone (DDS) and 4,4'-diamino diphenyl methane (DDM) can be specifically mentioned. The curing agent is present in an amount of about 2 to about 20 parts by weight, specifically, about 5 to about 15 parts by weight per 100 parts by weight of the epoxy resin.

The curing accelerator can be selected from the group consisting of imidazole compounds such as 2-alkyl-4-methyl imidazole compounds, 2-alkyl-4-ethyl imidazole compounds, 2-phenyl imidazole compounds and the like, metal borofluoride compounds such as tin borofluoride, zinc borofluoride and the like, and metal octoate compounds such as tin octoate, zinc octoate and the like. These various curing accelerator compounds can be used either singly or as a combination. In particular, borofluoride compounds and metal octoate compounds are preferred because these curing accelerators give an adhesive composition having good storage stability and easy controllability of the flowability behavior. The amount of curing accelerator is about 0.1 to about 3 parts by weight, specifically about 0.3 to about 1.5 parts by weight per 100 parts by weight of the epoxy resin.

In an exemplary embodiment, the epoxy composition further comprises an epoxy resin that is not in the form of an adduct. Exemplary epoxy resins are as described above. Exemplary non-halogenated epoxy resin products available on the market include those sold under the trade name EPIKOTE 828, 1001, 152 and 154 (each a product by Yuka Shell Epoxy Co.), ECON 102S, 103S and 104S (each a product by Nippon Kayaku Co.) and others. Again, non-halogenated epoxy resins are preferred, but halogenated epoxies can be used. Various commercial grades of brominated epoxy resin products are available on the market, including those sold under the trade names of EPIKOTE 5050, 5049, 5048 and 5045 containing about 49%, 26%, 25% and 19% by weight, respectively, of bromine (each a product by Yuka Shell Epoxy Co.), BREN-S containing about 35% by weight of bromine (a product by Nippon Kayaku Co.) and others. Combinations of different epoxy resins can be used.

In another exemplary embodiment, the epoxy composition further comprises a non-halogenated flame retardant, for example a metal oxide or hydroxide such as aluminum hydroxide, magnesium hydroxide, and aluminum oxide. To improve adhesion between the fillers and polymer, the filler can be treated with one or more coupling agents, such as silanes, zirconates, or titanates. The metal oxide or hydroxide can have an average particle diameter not exceeding 5 micrometers, specifically, not exceeding 1 micrometer, and be present in an amount of about 1 to about 50 parts by weight, specifically about 25 to 40 parts by weight, per 100 parts by weight of the epoxy resin.

Other exemplary flame retardants include various organic phosphorous-based compounds, for example an aromatic phosphate of the formula $(GO)_3P=O$, wherein each G is independently an C1-36 alkyl, cycloalkyl, aryl, alkylaryl, or arylalkyl group, provided that at least one G is an aromatic group. Two of the G groups can be joined together to provide a cyclic group, for example, diphenyl pentaerythritol diphosphate. Other suitable aromatic phosphates can be, for example, phenyl bis(dodecyl) phosphate, phenyl bis(neopentyl) phosphate, phenyl bis(3,5,5'-trimethylhexyl) phosphate, ethyl diphenyl phosphate, 2-ethylhexyl di(p-tolyl) phosphate, bis(2-ethylhexyl) p-tolyl phosphate, tritolyl phosphate, bis(2-ethylhexyl) phenyl phosphate, tri(nonylphenyl) phosphate, bis(dodecyl) p-tolyl phosphate, dibutyl phenyl phosphate, 2-chloroethyl diphenyl phosphate, p-tolyl bis(2,5,5'-trimethylhexyl) phosphate, 2-ethylhexyl diphenyl phosphate, or the like. A specific aromatic phosphate is one in which each G is aromatic, for example, triphenyl phosphate, tricresyl phosphate, isopropylated triphenyl phosphate, and the like. Examples of suitable di- or polyfunctional aromatic phosphorus-containing compounds include resorcinol tetraphenyl diphosphate (RDP), the bis(diphenyl) phosphate of hydroquinone and the bis(diphenyl) phosphate of bisphenol-A, respectively, their oligomeric and polymeric counterparts, and the like.

Metal phosphinate salts can also be used. Examples of phosphinates are phosphinate salts such as for example alicylic phosphinate salts and phosphinate esters. Further examples of phosphinates are diphosphinic acids, dimethylphosphinic acid, ethylmethylphosphinic acid, diethylphosphinic acid, and the salts of these acids, such as for example the aluminum salts and the zinc salts. Examples of phosphine oxides are isobutylbis(hydroxyalkyl) phosphine oxide and 1,4-diisobutylene-2,3,5,6-tetrahydroxy-1,4-diphosphine oxide or 1,4-diisobutylene-1,4-diphosphoryl-2,3-5,6-tetrahydroxycyclohexane. Further examples of phosphorus-containing compounds are NH1197® (Great Lakes), NH1511® (Great Lakes), NcendX P-30® (Albemarle), Hostaflam OP5500® (Clariant), Hostaflam OP910® (Clariant), EXOLIT 935 (Clariant), and Cyagard RF 1204®, Cyagard RF 1241® and Cyagard RF 1243® (Cyagard are products of Cytec Industries). In a particularly advantageous embodiment, a halogen-free version of the epoxy composition has excellent flame retardance when used with EXOLIT 935 (an aluminum phosphinate).

Other exemplary flame retardant compounds containing phosphorus-nitrogen bonds include phosphonitrilic chloride, phosphorus ester amides, phosphoric acid amides, phosphonic acid amides, phosphinic acid amides, and tris(aziridinyl) phosphine oxide. When present, the flame retardant is generally used in amounts of about 1 to about 25 parts by weight, more specifically about 10 to about 20 parts by weight, based on 100 parts by weight of epoxy-nitrile rubber adduct.

The epoxy composition can optionally be compounded with a vulcanizing agent, for example sulfur, zinc oxide, magnesium oxide, and the like either singly or as a combination. The amount of the vulcanizing agent is about 0.2 to about 10 parts by weight, specifically about 1 to about 5 parts by weight per 100 parts by weight of the epoxy-nitrile rubber adduct.

Other additives can optionally be present in the epoxy compositions, for example other resins, antioxidants, thermal stabilizers, colorants, UV absorbers, and the like. The amount of such additive will vary depending on their function, and can be, for example, about 0.1 to about 10 parts by weight per 100 parts by weight of the epoxy-nitrile rubber adduct. It has been found that an antioxidant will aid in increasing the thermal stability of the epoxy compositions.

The relative amounts of the adduct, optional epoxy resin, and other components are selected so as to provide the desired properties in the thermosetting epoxy composition, for example flow, thermal resistance, electrical properties, non-tackiness and toughness of the B-staged and the fully cured bond ply layers, and like considerations. In one embodiment, the adduct of the solid epoxy resin is the only epoxy component in the thermosetting epoxy composition.

In another embodiment, the epoxy composition consists essentially of the adduct, or the adduct and epoxy resin, for example a bisphenol A epoxy resin or a novolac epoxy resin. In the latter embodiment, the thermosetting epoxy composition consists essentially of 40 to 99 parts by weight (pbw), specifically 55 to 85 pbw, more specifically 50 to 70 pbw of adduct, and 1 to 35 pbw, specifically 10 to 30 pbw, more specifically 15 to 25 pbw of epoxy resin, each based on the total weight of the composition, with the remainder being the filler and, in some embodiments, additives such as flame retardants.

In still another embodiment, the adduct is used together with a small amount of a high molecular weight carboxy-functionalized nitrile rubber, in order to improve the toughness of the compositions, and optionally an epoxy resin. In this embodiment, the thermosetting epoxy composition comprises 40 to 99 pbw, specifically 55 to 85 pbw, more specifically 50 to 70 pbw of adduct; 1 to 20 pbw, specifically 5 to 15 pbw, more specifically 8 to 12 pbw of carboxylated nitrile rubber; and 0 to 30 pbw, specifically 5 to 25 pbw, more specifically 10 to 20 pbw of epoxy resin, each based on the total weight of the composition, with the remainder being the filler and, in some embodiments, additives such as flame retardants.

As previously stated, the dielectric thermosetting compositions described above further comprise the same or varying amounts of filler in each layer of the three-layer bond ply arrangement. One factor in the manufacture of the three-layer bond ply having the foregoing properties, in addition to good processing characteristics, is the selection of the type, size, and quantity of the filler present in the dielectric thermosetting composition. These factors are each important in adjusting the properties of the thermosetting composition, including flow upon lamination, flame resistance, CTE, thermal conductivity, Dk, Df, modulus and elongation. Often, a combination of fillers is used to obtain the desired balance of properties.

Exemplary fillers for use in the dielectric thermosetting composition include titanium dioxide (rutile and anatase), titania, barium titanate, strontium titanate, silica, including fused amorphous silica, corundum, wollastonite, aramide fibers (e.g., KEVLAR™ from DuPont), $Ba_2Ti_9O_{20}$, glass spheres, quartz, boron nitride, aluminum nitride, silicon carbide, beryllia, alumina, magnesia, magnesium hydroxide, melamine polyphosphate, melamine cyanurate, Melam, Melon, Melem, guanidines, phosphazanes, silazanes, DOPO (9,10-dihydro-9-oxa-10 phosphenathrene-10-oxide), DOPO (10-5 dihydroxyphenyl, 10-H-9 oxaphosphaphenanthreneloxide), mica, talcs, nanoclays, aluminosilicates (natural and synthetic), and fumed silicon dioxide (e.g., Cab-O-Sil, available from Cabot Corporation), used alone or in combination. Specific fillers include rutile titanium dioxide, surface treated/coated magnesium hydroxide and amorphous silica.

The fillers can be in the form of solid, porous, or hollow particles. The particle size of the filler affects a number of important properties including rheology prior to cure, maximum packing fraction, coefficient of thermal expansion, modulus, elongation, and flame resistance. In one embodiment, the filler has an average particle size of 0.1 to 15 micrometers, specifically 0.2 to 10 micrometers. A combination of fillers having a bimodal, trimodal, or higher average particle size distribution can be used.

To improve adhesion between the fillers and thermosetting polymer, the filler can be treated with one or more coupling agents, such as silanes, zirconates, or titanates. The filler can be pretreated, or the coupling agent can be added to the dielectric thermosetting composition as described in further detail below.

In one embodiment, as mentioned above, the amount of filler in the dielectric thermosetting composition can vary between each layer in the three-layer bond ply. In one variation of this embodiment, the amount of filler in the dielectric thermosetting composition of each layer is the same. In another variation, the amount of filler in the dielectric thermosetting composition of the intermediate layer is different than that of the outer layers, where the outer layers each have the same filler content. In still another variation, the amount of filler in the dielectric thermosetting composition of each layer is different. In this embodiment, regardless of filler content, however, each layer comprises the same dielectric thermosetting composition with the same type of filler disposed therein. The particular amount of filler and choice of filler(s) depends on the intended use of the dielectric thermosetting composition, and is adjusted to obtain the desired balance of properties. In one example, the filler content in the intermediate layer is chosen to maximize modulus and elongation, while the filler content in the outer layers is selected to optimize fill and flow on lamination. Further, by choosing proper filler types, particle size distribution, and loading level, an overall desirable balance of properties can be achieved for many applications. In an exemplary embodiment, the total amount of filler in the dielectric thermosetting composition can be about 0.1 to about 60 volume percent (vol %), based on the total volume of the dielectric thermosetting composition; specifically about 10 to about 50 vol %; and more specifically about 20 to about 50 vol %.

In another embodiment, the intermediate layer of the three layer bond ply contains at least two polymer components, e.g., a polyphenylene ether and a polybutadiene or polyisoprene polymer, or an epoxy and a nitrile rubber compound, along with filler. In this embodiment, the filler content in the three layers is the same, but the ratio of the main polymer components in the thermosetting polymer system can be somewhat different in the different layers. In one variation of this embodiment, the ratio of, e.g. polyphenylene ether to polybutadiene, is chosen to maximize the strength and elongation of the intermediate layer, while the ratio of these components in the outer layers is chosen to optimize fill and flow on lamination. The changes in ratio would not lead to significant differences in the electrical and thermal properties of the three layers in the bond ply.

In use, the components of the dielectric thermosetting composition are combined to form an intimate blend in a suitable solvent such as methylethyl ketone or toluene. The relative amount of thermosetting composition and solvent is selected to provide a coatable mixture, preferably using a minimum amount of solvent. The mixing temperature is regulated to avoid substantial decomposition, crosslinking, or other reaction of the components. Mixing continues until all components including the filler are uniformly dispersed throughout the dielectric thermosetting composition. As mentioned, the filler can be pretreated with silanes in a separate step for more efficient use of the agents. Optionally, silanes can be included in the slurry.

Figure 1:
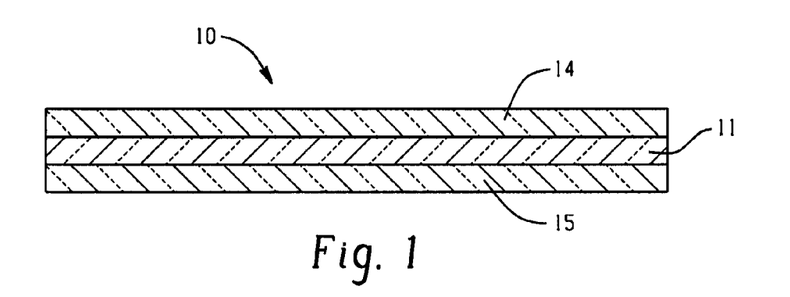
FIG. 1 shows an exemplary embodiment of a three-layer bond ply.
Figure 2:
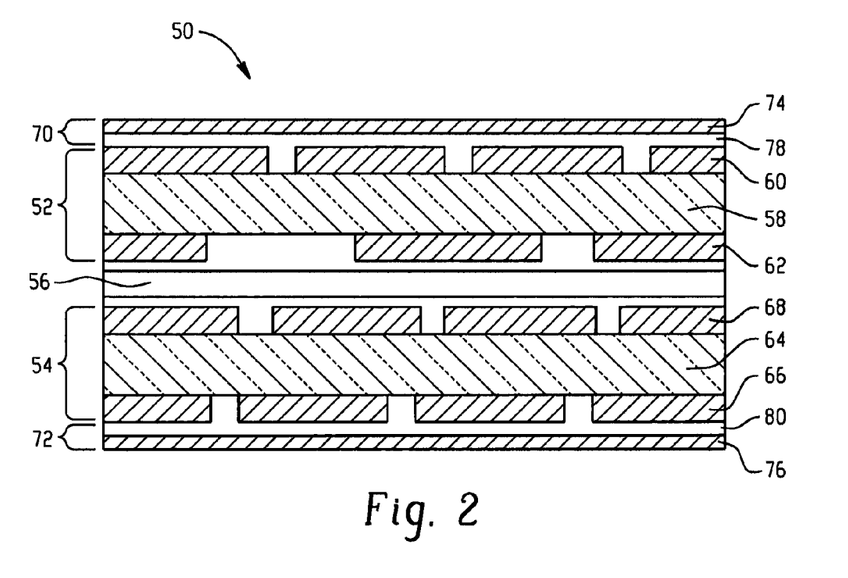
FIG. 2 shows an exemplary embodiment of a multilayer circuit comprising two double clad circuit laminates.

Exemplary embodiments of the three-layer bond ply, circuit laminates, and multi-layer circuits in accordance with the present invention are shown in FIGS. 1 and 2. In FIG. 1, a three-layer bond ply 10 includes a intermediate layer 11 comprising a thermosetting composition and a filler, sandwiched between first outer layer and second outer layer 14, 15 comprising the thermosetting composition and the filler, wherein the thermosetting composition of the intermediate layer has a degree of cure that is greater than a degree of cure of each thermosetting composition of the outer layers. The amount of filler in each layer can be the same or it can be different. Regardless of the ratio of thermosetting composition and filler composition within each layer, the thermosetting composition of the intermediate layer will have a degree of cure that is greater than the degree of cure of each of the thermosetting compositions of the first and the second outer layers. For example, the intermediate layer can be fully cured, while the outer layers are cured to a lesser degree, such as a layer uncured or B-staged. Also, as used herein, "disposed" means at least partial intimate contact between two layers and includes layers that partially or wholly cover each other.

In practice, the components of the dielectric thermosetting composition used to form the layers are dissolved and/or suspended to provide a coating mixture or solution. The solvent is selected so as to dissolve the resin composition, disperse the fillers and to have a convenient evaporation rate for forming and drying the layer. A non-exclusive list of possible solvents is xylene, toluene, methyl ethyl ketone, methyl isobutyl ketone, hexane, and higher liquid linear alkanes, such as heptane, octane, nonane, and the like, cyclohexane, isophorone, and various terpene-based solvents. Specific exemplary solvents include xylene, toluene, methyl ethyl ketone, methyl isobutyl ketone, and hexane, and still more specifically xylene and toluene. The concentration of the components of the composition in solution is not critical and will depend on the solubility of the components, the filler level used, the method of application, and other factors. In general, the solution comprises 10 to about 50 wt % solids (all components other than the solvent), more specifically about 15 to about 40 wt % solids, based on the total weight of the solution. The coating mixture can be formed onto a carrier from which it is later released, or alternatively onto a conductive metal layer that will later be formed into a layer of the circuit structure.

After the layer is formed, e.g., by casting, solvent is allowed to evaporate under ambient conditions, or by forced or heated air, to form the intermediate layer. The intermediate layer is partially (B-staged) or fully cured in the drying process, or the intermediate layer can be partially or fully cured, if desired, after drying. The dry process can include heat treatment by passing the intermediate layer through an in-line drying oven at a temperature of about 40 to 160° C., over about 2 to about 20 minutes. The outer layers are then applied to both sides of the intermediate layer, e.g. by casting or laminating or a combination thereof. This application may be done sequentially or simultaneously. The outer layers are dried, but are left uncured or B-staged. In use, these layers will be cured.

The thickness of the layers in the three-layer bond ply will depend on its intended use. In one embodiment, when used to join two circuit laminates, the total bond ply thickness is about 10 to about 100 micrometers; specifically about 20 micrometers to about 100 micrometers; and more specifically about 30 micrometers to about 75 micrometers. In one embodiment, the thickness of each layer is the same. In another embodiment, the uncured outer layers are unequal in thickness. For example, when the three-layer bond ply is used to sequentially add conductive layers to a core laminate, the thicker outer layer can be placed in physical communication with the circuitized core laminate, wherein the thicker outer layer is configured to fill in the circuitized features. The thinner outer layer, disposed on a side of the intermediate layer opposite the thicker layer, is in physical communication with the conductive layer being bonded to the core laminate via the three-layer bond ply. In this example, the layer thicknesses are optimized at the minimum required thicknesses to adequately fill in between circuitized features on the core laminate and for bonding the conductive layer thereto, while maintaining the thinnest possible three-layer bond ply.

In another embodiment, the three-layer bond ply can include a release film layer. The release film layer can be applied and bonded to one or both of the outer layers by passing the three-layer bond ply and release film together through a heating roller at a temperature of about 20 to about 160° C., using a linear pressure of about 0.2 to about 20 kg/cm. Alternatively, an outer dielectric layer can be applied directly to the release layer and the combination subsequently laminated to the intermediate layer. Exemplary release film layers include, for example, polyethylene, polypropylene, TPX resins, polyethylene terephthalate resins, and the like coated, for example, with a silicone-based releasing agent, as well as paper sheets coated with a polyethylene, polypropylene or TPX resin.

Multilayer circuits can be made by using the three-layer bond ply to bond multiple layers of circuit subassemblies into a single stacked circuit containing many circuitized conductive layers. Exemplary circuit subassemblies can include, without limitation, single clad laminates, double clad laminates, and the like. A single clad laminate, for example, comprises a conductive metal layer disposed on and in contact with a dielectric substrate layer. It is to be understood that in all of the embodiments described herein, the various layers can fully or partially cover each other, and additional conductive layers, patterned circuit layers, and dielectric layers can also be present. Optional adhesive layers (not shown) can also be present. A double clad circuit laminate comprises two conductive layers disposed on opposite sides of a dielectric substrate layer. One or both of the conductive layers can be in the form of a circuit.

FIG. 2 shows an exemplary multilayer circuit 50 comprising one or more circuit subassemblies as described herein. Multilayer circuit 50 has a first double clad circuit 52, a second double clad circuit 54, and a three-layer bond ply 56 disposed therebetween. Double clad circuit 52 comprises a dielectric substrate 58 disposed between two conductive circuit layers 60, 62. Double clad circuit 54 comprises a dielectric substrate 64 disposed between two conductive circuit layers 66, 68. The three-layer bond ply 56 is configured to adhere the two double-clad circuits together to form the multilayer circuit 50. The multilayer circuit 50 further includes two cap layers 70, 72. Each cap layer 70, 72 includes a conductive layer 74, 76 disposed on a bond ply layer 78, 80.

The bond ply layers 78, 80 can be single layer bond plies or they can be the three-layer bond plies as described herein.

Useful conductive layers for the formation of the circuit laminates, including multi-layer circuit laminates for use in vertically integrated interconnect structures or in cores for subassemblies, can include, without limitation, stainless steel, copper, gold, silver, aluminum, zinc, tin, lead, transition metals, combinations thereof, alloys thereof, and the like, with copper being exemplary. There are no particular limitations regarding the thickness of the conductive layer, nor are there any limitations as to the shape, size or texture of the surface of the conductive layer. Preferably however, the conductive layer comprises a thickness of about 3 micrometers to about 200 micrometers, specifically about 9 micrometers to about 100 micrometers. When two or more conductive layers are present, the thickness of the two layers can be the same or different.

In an exemplary embodiment, the conductive layer is a copper layer. Exemplary conductive layers include a thin layer of a conductive metal such as a copper foil presently used in the formation of circuits, for example, electrodeposited copper foils.

The copper foil can be made either by the electrodeposition (ED) on a rotating stainless steel drum from a copper sulfate bath, or by the rolling of solid copper bars. Where ED copper foil is used, the initial roughness of the base foil is created in the foil plating process on the "bath side" (or matte side) of the foil. Additional roughness is created in a secondary plating step. Where rolled foil used, roughness is imparted to the initially smooth and shiny foil by a secondary plating step.

This mechanical roughness can result in several drawbacks. As described in detail by Brist et al. (Gary Brist, Stephen Hall, Sidney Clouser, and Tao Liang, "Non-classical conductor losses due to copper foil roughness and treatment," p. 26, Circuitree, can 2005) and Ogawa et al. (N. Ogawa, H. Onozeki, N. Moriike, T. Tanabe, T. Kumakura, "Profile-free foil for high-density packaging substrates and high-frequency applications," p. 457, Proceedings of the 2005 Electronic Components and Technology Conference, IEEE), the roughness on a conductor surface can result in a substantial increase in conductor loss at high frequencies, with a rough conductor causing up to twice the conductor loss of a smooth one. Ogawa also describes the limitations to accurate circuit fabrication, most notably the accurate etching of fine lines and spaces that are caused by conductor roughness.

The roughness of a copper foil is generally characterized by contact profilometry or optical interferometry. Most foil manufacturers measure roughness with a contact profilometer, due to their long history with such a measurement system. Most of the values cited herein were measured using a Veeco Instruments WYCO Optical Profiler, using the method of white light interferometry. Since the roughness can exist on several different scales and will consist of many peaks and valleys with varying distances from a fixed reference plane, there are many different ways to numerically characterize the surface roughness. Two frequently reported quantities are the RMS roughness value, Rq, and the peak-to-valley roughness, Rz, with both reported in dimensions of length.

Conventional ED copper foil made for the circuit industry has had treated side Rz values of 7 to 20 micrometers (um) (corresponding to Rq values of about 1.2 to 4 um) when measured by the WYCO Optical Profiler. Contact profilometers tend to yield lower values, due to the stylus deforming the copper treatment as the measurement is made. The treated side of rolled copper foil exhibits Rz values of 3.5-5.5 um (corresponding to Rq values of 0.45-0.9 um). "Reverse treated" ED foils, such as Oak-Mitsui MLS-TOC-500 can also exhibit Rq values similar to those of rolled foils. The lower profile ED foils currently exhibit Rz values of 2 to 3 um. By WYCO measurement, the shiny side of rolled foil exhibits an Rz value of about 0.7 um and a corresponding Rq of about 0.1 um.

More recently, other types of low profile electrodeposited foils have been commercially available. These include Oak Mitsui products SQ-VLP, with an Rq value measured by the WYCO of 0.7 um and MQ-VLP with a WYCO Rq value of 0.47 um.

Both rolled and ED foils specially treated for the circuit industry are available from a number of commercial manufacturers. For example, low profile copper foils are commercially available from Oak Mitsui under the trade name "TOC-500" MLS and "TOC-500-LZ", from Nippon Denkai under the trade name "USLP", and from Furukawa under the trade name "F1WS". High profile copper foils are commercially available from Circuit Foil under the trade name "TWS." The copper conductive layer can be treated to increase surface area, treated with a stabilizer to prevent oxidation of the conductive layer (i.e., stainproofing), or treated to form a thermal barrier. Both low and high roughness copper conductive layers can be treated with zinc or zinc alloy thermal barriers, and can further optionally comprise a stain-proofing layer.

One or more of the dielectric substrate layers in the double clad laminates can comprise a dielectric material similar to that of the dielectric thermosetting composition of the three-layer bond ply, or the dielectric material can be different. Dielectric materials that can be used include, for example, glass fiber-reinforced epoxy or bismaleimide triazine (BT) resin, and other low polarity, low dielectric constant and low loss resins such as those based on resins such as 1,2-polybutadiene, polyisoprene, poly(etherimide) (PEI), polytetrafluoroethylene (PTFE), liquid crystal polymers, polyaryleneetherketones, polybutadiene-polyisoprene copolymers, poly(phenylene ether) resins, and those based on allylated poly(phenylene ether) resins. Combinations of low polarity resins with higher polarity resins can also be used, non-limiting examples including epoxy and poly(phenylene ether), epoxy and poly(ether imide), and cyanate ester and poly(phenylene ether). Such material can optionally further include woven, thermally stable webs of a suitable fiber, specifically glass (E, S, and D glass) or high temperature polyester fibers (e.g., KODEL from Eastman Kodak).

The double clad laminates and the multilayer circuit illustrated in FIG. 2 can be formed by means known in the art. In one embodiment, the lamination process entails placing layers of the dielectric material between one or two sheets of coated or uncoated conductive layers (an adhesive layer can be disposed between at least one conductive layer and at least one dielectric substrate layer) to form a circuit substrate. The layered material can then be placed in a press, e.g. a vacuum press, under a pressure and temperature and for a duration of time suitable to bond the layers and form a laminate. The same can be done to form the multilayer circuit. The three-layer bond ply is disposed between the two double clad laminates and the assembly can then be placed in a press, e.g. a vacuum press, under a pressure and temperature and for a duration of time suitable to bond the outer layers of the bond ply to the circuitized conductive layers of the double clad laminates. Lamination and curing can be by a one-step process, for example using a vacuum press, or by a multiple-step process.

In another embodiment, the three-layer bond ply can be used to sequentially add layers to the outside of a core laminate. When used as a buildup layer, the three-layer bond ply is disposed on a face of the core and adhered thereto using lamination. When a release film carrier is used for the three-layer bond ply, it is removed after lamination. In particular, the core laminate is built up by disposing one or more three-layer bond plies on the core circuitized conductive layers (i.e., wiring layers). For example, in one embodiment, the three-layer bond ply further comprises a conductive layer disposed on a side of the bond ply opposite the core laminate, which can be circuitized after lamination of the bond ply to the core laminate. In another embodiment, the three-layer bond play simply fills in and covers the circuitized features of the wiring layer on the core laminate. An additional wiring layer can then be formed by an additive metallization process on the outer surface of the bond ply opposite the core laminate.

The wiring layers of the core laminate comprise an electrically conductive surface with a plurality of circuitry patterns configured to provide the various wiring functions. The wiring layers can be formed of various conductive materials including, without limitation, copper, gold, nickel, silver, palladium, tin, combinations thereof, alloys thereof, and the like. In the latter example described above, the wiring layers can then be formed on the outer face of the three-layer bond ply by numerous deposition techniques. In a subtractive metallization process, a blanket layer of metal is formed on the bond ply; and a photoresist and metal etch process is used to remove a portion of the blanket layer to define the conductive traces of the wiring layer. The blanket layer of metal can be formed through either electroless plating or electrolytic plating. Electroless plating uses metal deposition from solution by chemical activation of the surface. Electrolytic plating uses current-induced metal deposition through an electrolyte. In a fully additive metallization process, conductive traces are directly formed on the outer layer of the bond ply, for example by printing, ink jetting or laser direct structuring the conductive wiring layer. In a semi-additive metallization process, a blanket seed layer of conductive metal is formed on the outer layer of the three-layer bond ply; after the conductive traces of a desired thickness are formed using a photoresist and plating process, the seed layer outside the traces is removed. In one embodiment, the newly added wiring layer has a thickness of about 1 micrometers to about 10 micrometers; specifically about 1 micrometers to about 5 micrometers; and more specifically about 3 micrometers.

In the manufacture of the circuit laminates by this method, the three-layer bond ply is formed, and then adhered or laminated to a face of the core laminate, specifically to a wiring layer on a face of the core. The uncured dielectric thermosetting composition of the outer layer disposed on the wiring layer permits adequate flow of the composition to fill between small circuit features of the wiring layer during lamination. In one embodiment, two three-layer bond plies are adhered or laminated to the core simultaneously, one on each face of the core.

Multiple wiring layers can be formed by disposing an additional three-layer bond ply on the outermost wiring layer on the core and repeating the wiring layer metallization process on the bond ply. The additional layers can be added to both sides of the core laminate and it is not necessary that the layers be symmetric on both sides of the core. For example, the structure may have more levels of bond ply and wiring layers on one side than the other side. Further, it is not necessary to apply the three-layer bond ply on both sides at the same time. For example, one can laminate a single three-layer bond ply and form a metallic wiring layer on one side of the core laminate, before laminating or coating the other side.

In still another embodiment, the three-layer bond ply can also be assembled directly onto a conductive layer, e.g. by coating or laminating or by a combination thereof A plurality of vias or holes can then be drilled (e.g., laser drilled) from the outer layer opposite the conductive layer through the three-layers of dielectric thermosetting composition and into the conductive layer. The plurality of via holes can be formed in the bond ply by known methods. In one embodiment, the plurality of via holes are formed by laser drilling. In another embodiment, other techniques are used, such as photo-structuring. In some embodiments, the vias are a tapered configuration having different top and bottom diameters. The plurality of vias can then be filled with a conductive paste. Exemplary electrically conductive pastes provide a conductive joint between the core laminate and outer wiring layers added by the three-layer bond ply. Such constructions are commonly found vertically integrated interconnect subassemblies. The electrically conductive paste is a composite material comprising a non-conductive polymer binder and conductive filler particles. Exemplary electrically conductive paste compositions can include, without limitation, nano- and micro-filled copper, silver, and low melting point (LMP)-based particles dispersed in an adhesive resin, such as epoxy.

After the vias have been filled with the paste, the outer conductive layer can be etched away leaving electrically conductive paste columns protruding from the outer layer surface of the bond ply. The bond ply-conductive layer assembly is laminated to a circuitized core laminate, wherein the conductive layer is on a side opposite the three-layer bond ply from the circuitized core laminate.

The three-layer bond ply described herein accordingly addresses the higher performance needs required by current semiconductor packaging applications. The cured intermediate layer makes the assembly more handleable during processing than a bond ply without a reinforcing layer. Moreover, the substantially solid intermediate layer in the three-layer arrangement provides a hard stop during lamination. In other words, the cured intermediate layer can prevent overflow of the less cured outer layers caused by the application of too much pressure in a lamination press. The three-layer bond ply, therefore, provides adequate flow to fill between small circuit features enabling a void free bond, yet does so without "squeeze-out" of the bond ply into pad openings. Further, eliminating the need for a reinforcement layer, such as glass fiber, means these improvements can be achieved with a thinner bond ply than is currently used. Still further, after cure of the outer layers, the dielectric material throughout the bond ply is homogenous. Homogeneity of the three-layer arrangement gives the bond ply uniform electrical, mechanical and thermal properties, all of which are highly desired for use in dense and high electrical performance applications.

Specifically, the three-layer bond ply, after cure, has low dielectric loss, in particular a dissipation factor of less than or equal to about 0.02 measured at 10 gigahertz; specifically less than or equal to about 0.01 measured at 10 gigahertz; more specifically less than or equal to about 0.005 measured at 10 gigahertz. Specifically, the three-layer bond ply, after cure, also has low dielectric constant, in particular a dielectric constant of less than or equal to about 4 measured at 10 gigahertz; specifically less than or equal to about 3.5 measured at 10 gigahertz; more specifically less than or equal to about 3.2 measured at 10 gigahertz.

The three-layer bond ply, after cure, also has a low CTE, specifically less than or equal to about 80 parts per million per degree Celsius (ppm/° C.) measured over 0 to 150° C.; specifically less than or equal to about 60 ppm/° C. measured over 0 to 150° C.; more specifically less than or equal to about 50 ppm/° C. measured over 0 to 150° C.

As mentioned above, while the multilayer bond ply is referred to for convenience as a three-layer bond ply, but it is understood less than three layers or one or more additional layers beyond the three can be present and disposed in any order. Likewise, it is understood that other applications beyond the applications described above can be envisioned for the multilayer bond ply. For example, the multilayer bond ply can be used in a laser clearing process, wherein laser work can be done on one or more of the outer layers that are cured to a lesser degree than the intermediate layer(s). The laser etching can be used, for example, to provide a cavity in one or more of the outer layers in which to bury a chip, capacitor, or the like. Other applications can include for example, shielding applications, wherein different metal layers are used with the multilayer bond ply instead of the circuits as described above. Still other applications can include non-circuit applications, mechanical applications, and the like. An example of a mechanical application can include using laser etched channels in one or more of the outer layers of the multilayer bond play as ink delivery systems. These are just some examples of applications for the multilayer bond ply, and it is understood that the bond ply described herein can be used in any application that will benefit from an easier to handle, adhesive-only type bond ply wherein an intermediate layer of the bond ply can prevent overflow of the outer layers without the use of a reinforcement layer. Moreover, the homogenous nature of the multilayer bond ply can provide advantages to many applications where uniform electrical and strength properties are highly desired.

Ranges disclosed herein are inclusive of the recited endpoint and are independently combinable. "Combination" is inclusive of blends, mixtures, alloys, reaction products, and the like. Also, "combinations comprising at least one of the foregoing" means that the list is inclusive of each element individually, as well as combinations of two or more elements of the list, and combinations of one or more elements of the list with non-list elements. The terms "first," "second," and so forth, herein do not denote any order, quantity, or importance, but rather are used to distinguish one element from another. The terms "a" and "an" herein do not denote a limitation of quantity, but rather denote the presence of at least one of the referenced item. The modifier "about" used in connection with a quantity is inclusive of the state value and has the meaning dictated by context, (e.g., includes the degree of error associated with measurement of the particular quantity). In addition, it is to be understood that the described elements can be combined in any suitable manner in the various embodiments.

All cited patents, patent applications, and other references are incorporated herein by reference in their entirety. However, if a term in the present application contradicts or conflicts with a term in the incorporated reference, the term from the present application takes precedence over the conflicting term from the incorporated reference.

While the invention has been described with reference to several embodiments thereof, it will be understood by those skilled in the art that various changes can be made and equivalents can be substituted for elements thereof without departing from the scope of the invention. In addition, many modifications can be made to adapt a particular situation or material to the teachings of the invention without departing from the essential scope thereof. Therefore, it is intended that the invention not be limited to the particular embodiments disclosed as the best mode contemplated for carrying out this invention, but that the invention will include all embodiments falling within the scope of the appended claims.

What is claimed is:

1. A circuit subassembly comprising a bond ply that does not include a glass or other fabric and comprises:
    a first outer layer comprising a thermosetting composition and a filler composition;
    a second outer layer comprising a thermosetting composition and a filler composition that is of the same type as that of the first outer layer; and
    an intermediate layer disposed between the first and the second outer layers, and comprising a thermosetting composition and a filler composition that is of the same type as the first and second outer layers,
    wherein the thermosetting composition of the intermediate layer has a degree of cure that is greater than a degree of cure for each of the thermosetting compositions of the first and the second outer layers and wherein the amount of filler is 10 to 60 volume percent.

2. The circuit subassembly of claim 1, wherein the bond ply comprises a thermosetting composition comprising an epoxy, polybutadiene, polyisoprene, polyimide, or a combination comprising at least one of the foregoing.

3. The circuit subassembly of claim 1, wherein the thermosetting composition comprises:
    a poly(arylene ether) component; and
    a carboxy-functionalized polybutadiene or polyisoprene polymer component.

4. The circuit subassembly of claim 1, wherein an amount of the filler composition in each layer of the bond ply is the same and a ratio of components in the thermosetting composition of each layer is different.

5. The circuit subassembly of claim 1, wherein an amount of the filler composition in the intermediate layer is equal to an amount of filler in the first and second outer layers.

6. The circuit subassembly of claim 1, wherein an amount of the filler composition in the intermediate layer is different than an amount of filler in the first and second outer layers.

7. The circuit subassembly of claim 1, wherein the amount of the filler composition in each outer layer is different.

8. The circuit subassembly of claim 1, wherein the filler composition comprises at least one of silica, titania, magnesium hydroxide, strontium titanate, barium titanate, $Ba_2Ti_9O_{20}$, boron nitride, aluminum nitride, and alumina.

9. The circuit subassembly of claim 1, wherein a thickness of each outer layer is different.

10. The circuit subassembly of claim 1, wherein a thickness of the intermediate layer is different than the thickness of the outer layers.

11. The circuit subassembly of claim 1, wherein the filler composition is present in an amount of up to 50 volume percent of each thermosetting composition.

12. The circuit subassembly of claim 1, wherein the thermosetting composition passes UL94 V0 testing in the absence of halogenated flame retardants.

13. The circuit subassembly of claim 1, wherein the intermediate layer is fully cured.

14. The circuit subassembly of claim 1, wherein the first and second out layers are uncured.

15. The circuit subassembly of claim 1, wherein the first and second out layers are partially cured.

16. An interconnect subassembly, comprising a bond ply that does not include a glass or other fabric and that comprises:
    a first outer layer comprising a thermosetting composition and a filler composition;
    a second outer layer comprising a thermosetting composition and a filler composition that is of the same type as that of the first outer layer; and an intermediate layer disposed between the first and the second outer layers, and comprising a thermosetting composition and a filler composition that is of the same type as the first and second outer layers, wherein the thermosetting composition of the intermediate layer has a degree of cure that is greater than a degree of cure for each of the thermosetting compositions of the first and the second outer layers and wherein the total amount of filler is 10 to 60 volume percent; and a conductive layer disposed on a side of one of the outer layers opposite the intermediate layer.

17. The interconnect subassembly of claim 16, further comprising a plurality of through-holes disposed in the bond ply; and an electrically conductive adhesive disposed in a selected one or more of the plurality of through-holes.

18. The interconnect subassembly of claims 16, wherein the conductive layer is copper.

19. The interconnect subassembly of claims 16, wherein the conductive layer is a wiring layer.

20. A multilayer circuit stackup for the formation of a multilayer circuit, comprising:
    a first circuit comprising a first dielectric layer and a first wiring layer disposed thereon;
    a second circuit comprising a second dielectric layer and a second wiring layer disposed thereon; and
    a bond ply disposed between the first circuit and the second circuit, wherein the bond ply does not include a glass or other fabric and comprises:
    a first outer layer comprising a thermosetting composition and a filler composition;
    a second outer layer comprising a thermosetting composition and a filler composition that is of the same type as that of the first outer layer; and
    an intermediate layer disposed between the first and the second outer layers, and comprising a thermosetting composition and a filler composition that is of the same type as the first and second outer layers,
    wherein an amount of the filler composition in the intermediate layer is 10 to 60 volume percent and different than an amount of filler in the first and second outer layers to increase the modulus and elongation of the intermediate layer.

21. The multilayer circuit stackup of claim 20, wherein the amount of the filler composition in each outer layer is different.

22. An interconnect subassembly, comprising a bond ply that does not include a glass or other fabric and that comprises:
    a first outer layer comprising a thermosetting composition and a filler composition;
    a second outer layer comprising a thermosetting composition and a filler composition that is of the same type as that of the first outer layer; and
    an intermediate layer disposed between the first and the second outer layers, and comprising a thermosetting composition and a filler composition that is of the same type as the first and second outer layers,
    wherein the thermosetting composition of the intermediate layer has a degree of cure that is greater than a degree of cure for each of the thermosetting compositions of the first and the second outer layers and wherein the total amount of filler is 10 to 60 volume percent; and
    a conductive layer disposed on a side of one of the outer layers opposite the intermediate layer;
    wherein the thermosetting composition in each layer comprises:
    a poly(arylene ether) component; and
    a carboxy-functionalized polybutadiene or polyisoprene polymer component; and
    wherein the amount of the filler composition in the intermediate layer is different than an amount of filler in the first and second outer layers to increase the modulus and elongation of the intermediate layer and/or the ratio of said components in the thermosetting composition differs in the layers to increase the fill and flow of the outer layers.

\* \* \* \* \*